United States Patent [19]

Arnold et al.

[11] Patent Number: 4,835,703

[45] Date of Patent: May 30, 1989

[54] METHOD OF COMPENSATING FOR NOISE AND PULSE PILE-UP IN THE COUNTING OF RANDOM PULSE DATA

[75] Inventors: Jane P. Arnold, Pittsburgh; James A. Neuner, Richland Township, Allegheny County, both of Pa.

[73] Assignee: Westinghouse Electric Corp., Pittsburgh, Pa.

[21] Appl. No.: 18,898

[22] Filed: Feb. 25, 1987

[51] Int. Cl.⁴ .................. G01R 23/10; G01R 23/15
[52] U.S. Cl. ................. 364/484; 364/486; 324/78 Q; 377/10; 377/47; 377/49
[58] Field of Search ............ 377/10, 49, 47, 48; 364/484, 486, 481, 480, 178; 324/78 Q, 78 R

[56] References Cited

U.S. PATENT DOCUMENTS

| | | | |
|---|---|---|---|
| 2,754,056 | 7/1956 | Friedman | 364/484 |
| 2,828,468 | 3/1958 | Ball et al. | 364/484 |
| 2,951,202 | 8/1960 | Gordon | 364/484 |
| 3,596,065 | 7/1971 | Lazarchick et al. | 364/484 |
| 3,909,599 | 9/1975 | Trott, Jr. et al. | 364/484 |
| 4,258,300 | 3/1981 | Fromont | 364/484 |
| 4,420,809 | 12/1983 | Pierce | 364/484 |
| 4,723,216 | 2/1988 | Premerlani | 364/484 |

Primary Examiner—Bruce Y. Arnold
Assistant Examiner—Terry S. Callaghan
Attorney, Agent, or Firm—R. P. Lenart

[57] ABSTRACT

A method of counting a plurality of pulses representative of randomly occurring events includes the steps of counting the number of pulses, having an amplitude exceeding a first threshold amplitude, which occur during a predetermined sampling period to obtain a first count and counting the number of pulses, having an amplitude exceeding a second threshold amplitude, which occur during the sampling period to obtain a second count. The second count is compared to a predetermined number and the counts for that sampling period are rejected if the second count is too large. If the second count is not too large, the true count is calculated by subtracting the second count from the first count. This counting procedure is repeated for a preselected number of successive sampling periods. After the final sampling period, all of the true counts are added to obtain an accumulated count and the accumulated count is multiplied by a scaling factor to obtain an output count. This output count is further multiplied by a compensating factor to account for dead time in the detector which receives the incoming data.

5 Claims, 2 Drawing Sheets

METHOD OF COMPENSATING FOR NOISE AND PULSE PILE-UP IN THE COUNTING OF RANDOM PULSE DATA

BACKGROUND OF THE INVENTION

This invention relates to a method of counting random pulsed data and, more particularly, to such a counting method which is used to count random pulsed data that is subject to noise and pulse pile-up.

The frequency of a periodic signal is typically measured by counting the number of events (pulses, zero crossings, etc.) that occur over some fixed sample period, T. If C events are counted over this interval, the measured frequency of the signal, F, is simply calculated from the equation:

$$F = C/T$$

The rate of change in frequency can be calculated from two successive measurements of frequency, $F_1$ and $F_2$, from the relationship:

$$\text{Rate} = (F_1 - F_2)/t$$

The calculations of frequency (level) and rate of change of frequency (rate) are only as accurate as their inputs. The accuracy of the inputs is significantly affected by the randomness of the data, the noise present in the data, and pulse pile-up errors. The randomness factor is very significant at low count levels, noise interference occurs over the entire range of input frequency, and pulse pile up is most significant at high frequencies since it occurs when pulses arrive too close together to be detected separately.

Within a nuclear reactor, neutron activity is used as an indication of the power being generated by the reactor. In general, power is proportional to neutron activity and an indication of the rate of change of power within the reactor is important for both control and safety systems. Instruments designed to measure neutron activity, called source range instruments, must cover the range of neutron activity from less than one pulse per second to millions of pulses per second and must meet stringent design criteria with respect to the measurement of frequency and the rate of change of frequency of neutron activity. Such design criteria specify accuracy, stability and time response specifications. In order to meet the specifications, the input count must be as accurate as possible.

In a neutron activity monitoring environment, there are two classes of noise that need to be eliminated. They are the low background noise and intermittent noise. The background noise typically results from background gamma radiation and the intermittent noise typically results from large electromagnetic interference.

For a pulse, which represents neutron activity, to be counted, it must be detected. In typical source range instruments, there is a minimum amount of time which must occur between successive pulses in order for distinct pulses to be counted. This amount of time is called the dead time. The dead time of an instrument is determined by the neutron detector and the associated electronics. It will also be influenced by the average width of the input pulses. When designing a source range instrument, dead time is obviously kept to a minimum. However, because of the random nature of radioactive decay, there is always some possibility that a pulse will be lost because it occurs too soon after the previous pulse or before the previous pulse ended. The resulting dead time losses can cause up to a 35% error in pulse count at higher frequencies.

It is therefore desirable to have a method of counting random pulsed data which compensates for noise and pulse pile-up which occurs in a neutron activity monitoring system.

SUMMARY OF THE INVENTION

The present invention provides a method of counting a plurality of pulses, representative of randomly occurring events, which includes the steps of counting the number of pulses having amplitudes which exceed a first threshold amplitude over a predetermined sampling period to obtain a first count and counting the number of pulses, having amplitudes exceeding a second threshold amplitude, which occur during the sampling period to obtain a second count. If the second count is too large, the entire sample is judged to be too corrupt and is rejected. If the second count is at an acceptable level, a true count is determined by subtracting the second count from the first count. This procedure is repeated for a plurality of successive sampling periods. After a predetermined number of sampling periods, the true counts are added to obtain an accumulated count and the accumulated count is corrected for missing sample periods that were too corrupted by noise, by multiplying by a scaling factor to obtain an output count.

To compensate for pulse pile-up, the output count is divided by a compensating factor to get a compensated count. In the preferred embodiment, the scaling factor is equal to the ratio of the total number of sampling periods to the number of sampling periods which yield true counts, and the compensating factor is equal to $(1 - mT)$ where m is the output count value and T is the dead time.

DESCRIPTION OF THE PREFERRED EMBODIMENT

Figure 1:
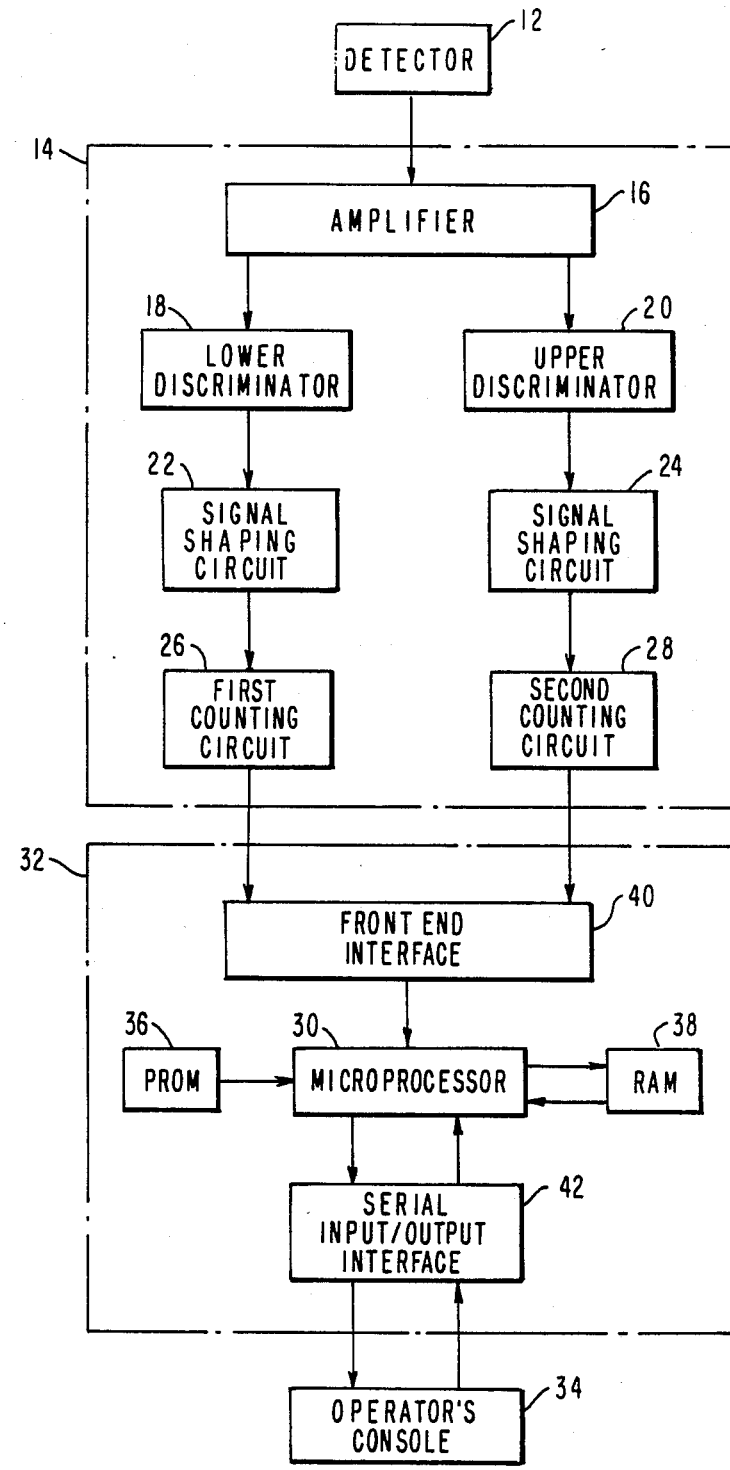
FIG. 1 is a block diagram of a source range instrument which may be used to perform the method of the present invention.

Referring to the drawings, FIG. 1 is a block diagram of a source range instrument for use in a nuclear reactor which may be used to perform the method of the present invention. The instrument includes a suitable neutron detector 12 that generates a pulse of current each time a neutron enters the detector. This pulse of current is fed to the front end circuitry 14 of the instrument. This front end circuitry includes an amplifier 16, a lower discriminator 18, an upper discriminator 20, signal shaping circuits 22 and 24, a first counter 26 and a second counter 28. The front end circuitry amplifies the detector current and by means of a lower discriminator circuit distinguishes between current pulses due to neutron activity and those pulses caused by external low level background noise in the system. The pulses are then further shaped and passed to the first front end counting circuit 26. The upper discriminator is used to distinguish current pulses occurring due to neutrons from external large electromagnetic interference. These pulses are shaped by shaping circuit 24 and passed to a second counting circuit 28. The front end counting circuits count pulses for successive one millisecond sampling periods and store 100 of these values before interrupting the microprocessor 30 in the system microcomputer 32. The counters are double buffered so that counting can continue during the next 100 millisecond period while the processor performs its tasks of correcting for noise and pulse pile-up as well as determining the frequency of the incoming pulses and the rate of change of incoming pulses and displays the results on the operator's console 34. The microcomputer includes standard components such as an Intel 8086 processor, suitable programmable read only memory 36 and random access memory 38, and suitable digital parallel and serial interface circuits 40 and 42 to provide communication between the processor and the front end circuit and operator's console.

When the processor receives an interrupt from the front end counting circuits, the processor stores the count values for the previous 100 millisecond sampling interval in the table. The method of this invention ensures that the table contains more accurate event counts by compensating for noise and pulse pile-up in the data received by the detector.

As stated above, both low background noise and intermittent noise must be eliminated. This is accomplished through the use of two discriminators in the front end circuitry. The lower discriminator 18 compares the amplitude of the incoming pulses with a lower threshold and passes pulses which exceed this threshold to the first counter 26. Therefore, background gamma radiation noise is rejected by this first discriminator.

The upper discriminator 20 is used to reject intermittent low duty cycle noise resulting from large external electromagnetic interference. This discriminator compares the amplitude of the incoming pulses to a second higher threshold and only passes pulses having amplitudes which exceed this threshold to the second counting circuit. All pulses falling between the two threshold levels are assumed to represent legitimate data. In the preferred embodiment, counter 26 is a twelve bit counter and counter 28 is a four bit mod 2 counter.

The data from both of these counters is combined into a sixteen bit sample with L representing the lower twelve bits corresponding to the count in the first counter and U representing the upper four bits corresponding to the count in the second counting circuit. Each sixteen bit data sample represents the pulses detected during a one millisecond sample period. One hundred of these data samples are processed and summed to produce a single sample count for further processing. This single sample count is a 24 bit number which is an accurate representation of the actual number of pulses detected during the preceding 100 millisecond time period. To obtain this 24 bit output count, the data samples are processed to compensate for both noise and pulse pile-up in the input data. To compensate for noise, first the count in the U register is compared with a predetermined number, which may be its maximum count. If the count exceeds the predetermined number, the sample is considered to be too corrupt to use and is not entered into the final output count sum. These samples are considered to be noisy samples. If the count in the U register is less than the predetermined number, then the number of genuine pulses for that sample is calculated by subtracting the count in the U register from the count in the L register. If the U register is a mod 2 counter as in the preferred embodiment, then the count in the U register must be multiplied by 2 before performing this calculation. The results of this calculation are considered to be good or valid samples and are included in the final summation.

If after processing all of the data samples, the number of good samples summed is less than a preselected number, for example, 50 then the resultant output count is considered to be unreliable and an alarm may be sounded. In this case, the last valid sum would be used for subsequent computations by the microcomputer.

If the number of good samples exceeds the preset number, then the sum of the good samples is scaled up to compensate for missing counts from noisy samples that were discarded by multiplying it by the ratio of the number of total samples to the number of good samples. This produces the output count which is eventually stored in the historical data table.

To compensate for pulse pile-up errors in the data, the output count is multiplied by a compensating factor. There are two models commonly used to described dead time behavior in neutron activity detectors: paralyzable and non-paralyzable. In the non-paralyzable case, dead times are a constant. When a pulse occurs, the dead time starts. If another pulse should arrive before the dead time is over, it is lost. The following equation can be used to compensate for a system that can be modeled by the non-paralyzable case:

$$n = m/(1 - mT)$$

where n is the true pulse count, m is the recorded pulse count and T is the system dead time.

In the paralyzable case, dead times following a pulse are effectively of varying length. When a pulse occurs, the system experiences a period of dead time. If during this period, another pulse should arrive, the dead time is extended by another period of system dead time. The following equation is used to compensate for a detector that can be modeled by the paralyzable case:

$$m = ne^{-nT}$$

where n is the true pulse count, m is the recorded pulse count and T is the system dead time.

Figure 2:
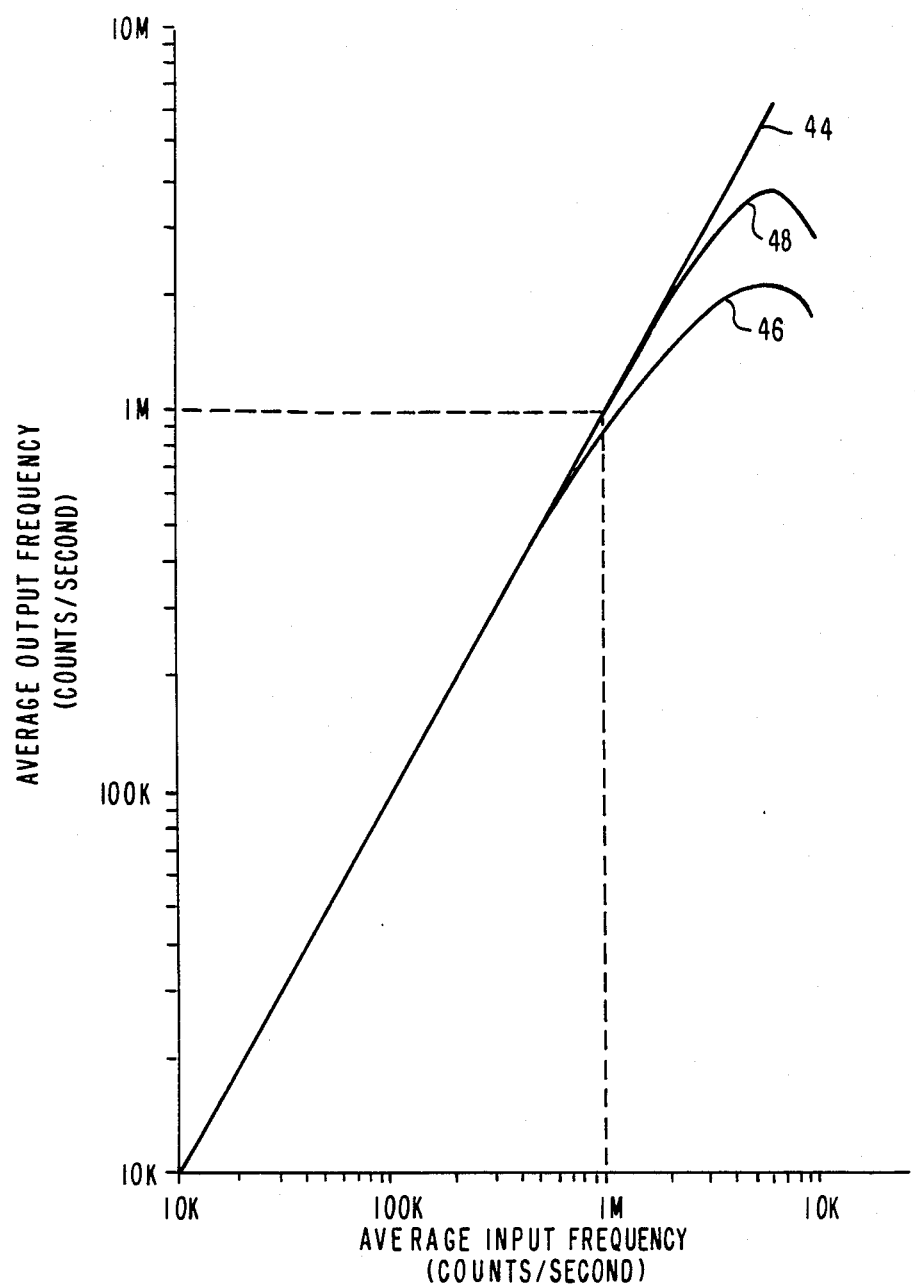
FIG. 2 is a series of curves which illustrate the effects of pulse pile-up compensation in the method of the present invention.

A typical front end circuit of a source range instrument is usually more closely modeled by the paralyzable case. Unfortunately, the equation for the paralyzable case requires an iterative solution. Since this solution would require excessive computer capability and time, this invention employs the equation which models the non-paralyzable case. FIG. 2 shows a series of curves which illustrate the effects of using the non-paralyzable compensation equation for a simulated neutron detector having an average or fixed dead time of 200 nanoseconds. Curve 44 represents the ideal condition wherein the average output frequency equals the average input frequency. Curve 46 represents the simulated measured value of output frequency versus input frequency for an uncompensated count. Curve 48 represents the simulated resulting output frequency versus input frequency using the compensation equation for the non-paralyzable case. It is clear from FIG. 2 that curve 48 tracks the ideal curve 44 for significantly higher count frequencies than the uncompensated curve 46.

Source range instruments which use the method of this invention compensate for noise and pulse pile-up by using two discriminators and two counters and by processing the resulting counts as described. Although the intended application of this invention is in the measurement of neutron activity in a nuclear reactor operating at low power levels, the method is applicable to processing any randomly occurring statistical data.

Although the present invention has been described in terms of what is at present believed to be its preferred embodiment, it will be apparent to those skilled in the art that various changes may be made without departing from the scope of the invention. It is therefore intended that the appended claims cover such changes.

What is claimed is:

1. A method of monitoring neutron activity in a nuclear reactor, said method comprising the steps of:
   a. generating a plurality of electric pulses in response to neutron activity, background noise and electromagnetic interference, said pulses having various amplitudes;
   b. counting the number of pulses, having an amplitude exceeding a first threshold amplitude, which occur in a predetermined sampling period, to obtain a first count;
   c. counting the number of pulses, having an amplitude exceeding a second threshold amplitude, which occur in said predetermined sampling period, to obtain a second count;
   d. comparing said second count to a predetermined number;
   e. rejecting said first and second count if said second count exceeds said predetermined number;
   f. calculating a true count for said sampling period, if said second count does not exceed said predetermined number, by subtracting said second count from said first count;
   g. repeating steps a, b, c, d, e and f for a plurality of successive sampling periods;
   h. adding all of said true counts calculated for said plurality of sampling periods, to obtain an accumulated count; and
   i. multiplying said accumulated count by a scaling factor o obtain an output count having a magnitude representative of actual neutron activity.

2. The method of claim 1, wherein said scaling factor is the ratio of the total number of sampling periods to the number of sampling periods yielding true counts.

3. The method of claim 1, further comprising the step of:
   dividing said output count by a compensating factor to get a compensated count.

4. The method of claim 3, wherein said compensating factor is (1−mT) where m is the output count and T is a predetermined dead time.

5. The method of claim 1, further comprising the step of:
   issuing an alarm signal if the number of true counts for said plurality of sampling periods is less than a fixed number.

* * * * *